(12) United States Patent
Yoko et al.

(10) Patent No.: US 7,265,486 B2
(45) Date of Patent: Sep. 4, 2007

(54) LIGHT EMITTING DIODE INCLUDING A COVER COVERING A LIGHT EMITTING DIODE ELEMENT

(75) Inventors: Toshinobu Yoko, 31-1-120, Todo Monnomae, Uji-shi, Kyoto 611-0013 (JP); Masahide Takahashi, 1-113, Kyodai Shokuin Shukusha, Gokasho, Uji-shi, Kyoto 611-0011 (JP); Kenji Matsuno, Joyo (JP)

(73) Assignees: Toshinobu Yoko, Uji-shi (JP); Masahide Takahashi, Uji-shi (JP); Seiwa Electric Mfg. Co., Ltd., Joyo-shi (JP)

(*) Notice: Subject to any disclaimer, the term of this patent is extended or adjusted under 35 U.S.C. 154(b) by 333 days.

(21) Appl. No.: 10/901,222

(22) Filed: Jul. 29, 2004

(65) Prior Publication Data
US 2005/0023540 A1    Feb. 3, 2005

(30) Foreign Application Priority Data
Jul. 31, 2003   (JP) .............................. 2003-284472

(51) Int. Cl.
*H05B 33/04* (2006.01)
*H05B 33/00* (2006.01)

(52) U.S. Cl. .................. 313/485; 313/512; 313/501; 313/486; 257/98; 257/100

(58) Field of Classification Search ............. 313/512; 257/98, 100
See application file for complete search history.

(56) References Cited
U.S. PATENT DOCUMENTS
5,198,479 A * 3/1993 Shiobara et al. ...... 257/E33.059
6,632,892 B2 * 10/2003 Rubinsztajn et al. 257/E33.059
2005/0212008 A1 * 9/2005 Miyoshi ..................... 257/100

FOREIGN PATENT DOCUMENTS

| JP | 6-313056 A | 11/1994 |
|---|---|---|
| JP | 2927279 A | 5/1999 |
| JP | 3036465 A | 2/2000 |
| JP | 2000-349340 A | 12/2000 |
| JP | 3152238 B2 | 1/2001 |
| JP | 2001-48575 A | 2/2001 |
| JP | 2001-279178 A | 10/2001 |
| JP | 2002-241525 A | 8/2002 |
| JP | 2002-338833 A | 11/2002 |
| JP | 2003-86846 A | 3/2003 |
| JP | 2003-163380 A | 6/2003 |
| JP | 2003-197978 A | 7/2003 |
| JP | 2005-11933 A | 1/2005 |

* cited by examiner

*Primary Examiner*—Mariceli Santiago
(74) *Attorney, Agent, or Firm*—Birch, Stewart, Kolasch & Birch, LLP

(57) ABSTRACT

In an LED (Light Emitting Diode) including a cover covering an LED element, the cover is formed using glass having a composition $R_n SiO_{2-n/2}$. The glass according to the present invention is low melting point glass with a softening temperature of −40° C. to 300° C., melts at lower temperatures compared to conventional glass, and can safely form the cover without damaging the LED element. Since glass has better moisture shield performance and resistance to light compared to epoxy resins, the cover is formed using glass, and consequently deterioration of the LED element and a phosphor caused by moisture is reduced, deterioration of the cover caused by light is reduced, and changes in color and luminous intensity are restrained.

17 Claims, 9 Drawing Sheets

FIG. 3

|  | LUMINOUS INTENSITY (RELATIVE VALUE) ||
|---|---|---|
|  | BEFORE EXPERIMENT | AFTER 1000 HOURS |
| LED OF PRESENT INVENTION | 100 | 98 |
| CONVENTIONAL LED | 100 | 70 |

FIG. 4

|  | LUMINOUS INTENSITY (RELATIVE VALUE) | |
|---|---|---|
|  | BEFORE EXPERIMENT | AFTER 1000 HOURS |
| LED OF PRESENT INVENTION | 100 | 90 |
| CONVENTIONAL LED | 100 | 70 |

FIG. 5

|  | LUMINOUS INTENSITY (RELATIVE VALUE) ||
|---|---|---|
|  | BEFORE EXPERIMENT | AFTER 1000 HOURS |
| LED OF PRESENT INVENTION | 100 | 92 |
| CONVENTIONAL LED | 100 | 58 |

FIG. 6

|  | LUMINOUS INTENSITY (RELATIVE VALUE) ||
|  | BEFORE EXPERIMENT | AFTER 1000 HOURS |
| --- | --- | --- |
| LED OF PRESENT INVENTION | 100 | 97 |
| CONVENTIONAL LED | 100 | 71 |

FIG. 7

|  | LUMINOUS INTENSITY (RELATIVE VALUE) | |
| --- | --- | --- |
|  | BEFORE EXPERIMENT | AFTER 1000 HOURS |
| LED OF PRESENT INVENTION | 100 | 93 |
| CONVENTIONAL LED | 100 | 70 |

FIG. 8

|  | LUMINOUS INTENSITY (RELATIVE VALUE) ||
| --- | --- | --- |
|  | BEFORE EXPERIMENT | AFTER 1000 HOURS |
| LED OF PRESENT INVENTION | 100 | 91 |
| CONVENTIONAL LED | 100 | 60 |

LIGHT EMITTING DIODE INCLUDING A COVER COVERING A LIGHT EMITTING DIODE ELEMENT

CROSS-REFERENCE TO RELATED APPLICATIONS

This non-provisional application claims priority under 35 U.S.C. §119(a) on Patent Application No. 2003-284472 filed in Japan on Jul. 31, 2003, the entire contents of which are hereby incorporated by reference.

BACKGROUND OF THE INVENTION

The present invention relates to a light emitting diode comprising a light emitting diode element and a transparent cover covering the light emitting diode element partly or completely, and used for a display device, lighting, a backlight for liquid crystals, etc.

A light emitting diode (hereinafter referred to as the LED) is a light emitting device comprising an LED element that is a semiconductor light emitting element with a p-n junction, and has a small size and superior characteristics in terms of power consumption, light emission characteristic, durability, etc. Therefore, the LED is used for various indicators and light sources. At present, LEDs that emit light of various wavelengths, such as ultraviolet, blue, green, and red, have been developed. In particular, an LED comprising three LED elements for emitting red, green and blue lights respectively and capable of emitting any color by adjusting the emission intensity of each LED element has been put to practical use and is used in a full-color display, etc. Moreover, an LED that emits white light was developed by incorporating a plurality of LED elements having mutually different emission wavelengths into one LED, or combining an LED element with a phosphor for converting the wavelength of light emitted from the LED element, and such an LED is used for lighting, a backlight of liquid crystals, etc.

FIG. 1 is a front sectional view showing a conventional LED. The LED comprises lead frames 13 and 14, and the lead frame 13 has a recessed portion 13*a* in an end thereof. An LED element 11 constructed by stacking a plurality of semiconductor layers is adhered and fixed on the bottom of the recessed portion 13*a* by die-bonding. One of the electrodes of the LED element 11 is wire-bonded to the lead frame 13 by a metal wire 15, and the other electrode is wire-bonded to the lead frame 14 by a metal wire 15. The recessed portion 13*a* is filled with a transparent resin, so that a cover 12 covering the LED element 11 is formed. The end of the lead frame 13 where the cover 12 is formed and the end of the lead frame 14 are disposed in a mold 16 made of a transparent resin and having a top functioning as a convex lens. A transparent resin that forms the cover 12 contains a phosphor for converting the wavelength of light emitted from the LED element 11. For example, in the case where the LED element 11 is an LED element 11 that emits blue light and a phosphor for converting blue light into light of longer wavelengths is used, part of the blue light is converted into light of longer wavelengths and the LED emits white light. Examples of LEDs as described above are disclosed in Japanese Patent Publications Nos. 2927279, 3036465, and 3152238. In addition, a mono-color LED that does not have the cover 12, and an LED that does not have the cover 12 but has the mold 16 including a phosphor are widely used.

In a conventional LED, an epoxy resin is mainly used as a transparent resin for forming the mold 16, and an epoxy resin, silicone resin or the like is used as a transparent resin for forming the cover 12. Since resins such as an epoxy resin have a characteristic causing deterioration such as yellowing with light having a short wavelength, if an LED element 11 that emits light having a short wavelength such as blue light or ultraviolet light is used as the LED element 11, an LED comprising the cover 12 or mold 16 formed using such a resin has a problem that the light emission efficiency is lowered when used over a long period of time. Moreover, since resins such as an epoxy resin, silicone resin and acryl-based resin have insufficient moisture shield performance, an LED comprising the cover 12 or mold 16 formed using such a resin has a problem that the LED element 11 or the phosphor is deteriorated by humidity, and the color and luminous intensity change with use.

On the other hand, glass whose main component is silicon oxide is known as a transparent material which is superior to resins in terms of the resistance against deterioration caused by light of a short wavelength and the moisture shield performance. Since the melting point of soda glass used for common glass products is around 600° C., if the LED element 11 is covered with the melted soda glass and the soda glass is cooled and solidified to form the cover 12 or mold 16, the LED element 11 is damaged by the heat of the melted soda glass, and therefore the cover 12 or mold 16 can not be formed using soda glass. Further, even if lead glass containing lead, namely so-called low melting point glass is used, it is difficult to form the cover 12 or mold 16 without damaging the LED element 11 because the melting point of the lead glass is around 400° C. Japanese Patent Application Laid-Open No. 2001-48575 discloses low melting point glass having a melting point of 250° C. to 500° C. and containing no lead.

BRIEF SUMMARY OF THE INVENTION

The present invention has been made with the aim of solving the above problems, and it is an object of the present invention to provide an LED capable of restraining changes in color and luminous intensity by forming a cover by using low melting point glass that softens at lower temperatures of not higher than 300° C. compared to conventional glass, without damaging an LED element.

A light emitting diode according to a first aspect of the invention is a light emitting diode comprising: a light emitting diode element; and a transparent cover covering the light emitting diode element partly or completely, wherein the cover is formed using glass having a composition including $R_n SiO_{2-n/2}$, where R is at least one group selected from a phenyl group ($C_6H_5$—), an ethyl group ($C_2H_5$—), a methyl group ($CH_3$—), a benzoyl group ($C_6H_5CO$—), a benzyl group ($C_6H_5CH_2$—) and a vinyl group ($CH_2=CH$—).

A light emitting diode according to a second aspect of the invention is a light emitting diode comprising: a light emitting diode element; and a transparent cover covering the light emitting diode element partly or completely, wherein the cover is formed using glass having a composition composed of a mole % of $C_6H_5SiO_{3/2}$ and b mole % of $(C_6H_5)_2SiO$, where a+b=100, $10 \leq a \leq 100$, and $0 \leq b \leq 90$.

A light emitting diode according to a third aspect of the invention is a light emitting diode comprising: a light emitting diode element; and a transparent cover covering the light emitting diode element partly or completely, wherein the cover is formed using glass having a composition composed of a mole % of $C_6H_5SiO_{3/2}$ and b mole % of $(CH_3)_2SiO$, where a+b=100, $10 \leq a \leq 100$, and $0 \leq b \leq 90$.

A light emitting diode according to a fourth aspect of the invention is a light emitting diode comprising: a light emitting diode element; and a transparent cover covering the light emitting diode element partly or completely, wherein the cover is formed using glass having a composition composed of a mole % of $CH_3SiO_{3/2}$ and b mole % of $(C_6H_5)_2SiO$, where a+b=100, $10 \leq a \leq 100$, and $0 \leq b \leq 90$.

A light emitting diode according to a fifth aspect of the invention is a light emitting diode comprising: a light emitting diode element; and a transparent cover covering the light emitting diode element partly or completely, wherein the cover is formed using glass having a composition composed of a mole % of $CH_3SiO_{3/2}$ and b mole % of $(CH_3)_2SiO$, where a+b=100, $10 \leq a \leq 100$, and $0 \leq b \leq 90$.

A light emitting diode according to a sixth aspect of the invention is based on the second through fifth aspects, wherein a=60 to 90, and b=10 to 40.

According to the first, second, third, fourth, fifth and sixth aspects, in an LED comprising a cover covering an LED element, the cover is formed using glass having a composition $R_nSiO_{2-n/2}$, thereby improving the resistance to deterioration caused by light of a short wavelength and the moisture shield performance. As a result, the durability and quality of the LED are improved.

In a light emitting diode according to a seventh aspect of the invention, the glass has a softening temperature ranging from −40° C. to 300° C. In the seventh aspect, since the softening temperature of the glass that forms the cover is −40° C. to 300° C., the glass softens (melts) at temperatures equal to or lower than 300° C. and can form the cover without damaging the LED element. Consequently, the resistance to deterioration caused by light of a short wavelength and the moisture shield performance are improved, thereby realizing an LED with improved durability and quality.

In a light emitting diode according to an eighth aspect of the invention, the glass is capable of being re-melted repeatedly within the softening temperature range. In the eighth aspect, since the glass can be re-melted repeatedly within the softening temperature range, it is possible to easily process the cover and readily manufacture the LED.

In a light emitting diode according to a ninth aspect of the invention, the glass is capable of being melted only a predetermined number of times within the softening temperature range. In the ninth aspect, the glass that forms the cover can be melted at temperatures equal to or lower than 300° C. only a predetermined number of times, and, after the glass is melted the predetermined number of times, the cover does not melt even when the temperature is increased. Therefore, the durability of the LED is improved.

In a light emitting diode according to a tenth aspect of the invention, the cover is formed by further adding one or a plurality of kinds of pigments, or a phosphor for converting an emission wavelength of the light emitting diode element, to the glass. In the tenth aspect, since the cover is produced by adding a pigment or a phosphor to the glass, the emission color of the LED is adjusted. It is therefore possible to realize an LED with an emission color adjusted according to an application.

A light emitting diode according to an eleventh aspect of the invention further comprises: a lead frame having a recessed portion; and a transparent mold for covering the recessed portion and the cover, wherein the light emitting diode element is mounted on a bottom of the recessed portion, and the recessed portion in which the light emitting diode element is mounted on the bottom is filled with the cover. In the eleventh aspect, the LED element is mounted in the recessed portion provided in an end of the lead frame, the cover is formed by filling the recessed portion having the LED element with the glass, and the recessed portion and the cover are further covered with the transparent mold. Thus, the LED element is protected by the cover and the mold, and the durability of the LED is improved.

In a light emitting diode according to a twelfth aspect of the invention, the recessed portion is filled with the cover at a position closer to the bottom than a plane formed by the brim of the recessed portion. In the twelfth aspect, since the cover is formed by filling the recessed portion at a position closer to the bottom than a plane formed by the brim of the recessed portion, the emission direction of light emitted by the LED is limited to the aperture direction of the recessed portion. As a result, the leakage of light in a lateral direction is reduced, and the light emission efficiency of the LED is improved.

A light emitting diode according to a thirteenth aspect of the invention further comprises a wiring board, wherein the light emitting diode element is mounted on the wiring board. In the thirteenth aspect, a surface mount LED with improved durability and quality is realized.

In a light emitting diode according to a fourteenth aspect of the invention, the light emitting diode element has an emission wavelength of 280 nm to 450 nm. In the fourteenth aspect, the emission wavelength of the LED element is a short wavelength region of 280 nm to 450 nm. Therefore, by combining the LED with a phosphor, it is possible to realize a white light source having good light emission efficiency and excellent durability and capable of being used for lighting.

The above and further objects and features of the invention will more fully be apparent from the following detailed description with accompanying drawings.

BRIEF DESCRIPTION OF THE SEVERAL VIEWS OF THE DRAWINGS

FIG. 3 is a table showing a change in the luminous intensity of an LED of the present invention (Embodiment 1) and a conventional LED;

FIG. 4 is a table showing a change in the luminous intensity of an LED of the present invention (Embodiment 1) and a conventional LED;

FIG. 5 is a table showing a change in the luminous intensity of an LED of the present invention (Embodiment 1) and a conventional LED;

FIG. 6 is a table showing a change in the luminous intensity of an LED of the present invention (Embodiment 2) and a conventional LED;

FIG. 7 is a table showing a change in the luminous intensity of an LED of the present invention (Embodiment 2) and a conventional LED;

FIG. 8 is a table showing a change in the luminous intensity of an LED of the present invention (Embodiment 2) and a conventional LED.

DETAILED DESCRIPTION OF THE INVENTION

The following description will specifically explain the present invention, based on the drawings illustrating some embodiments thereof.

EMBODIMENT 1

Figure 1:
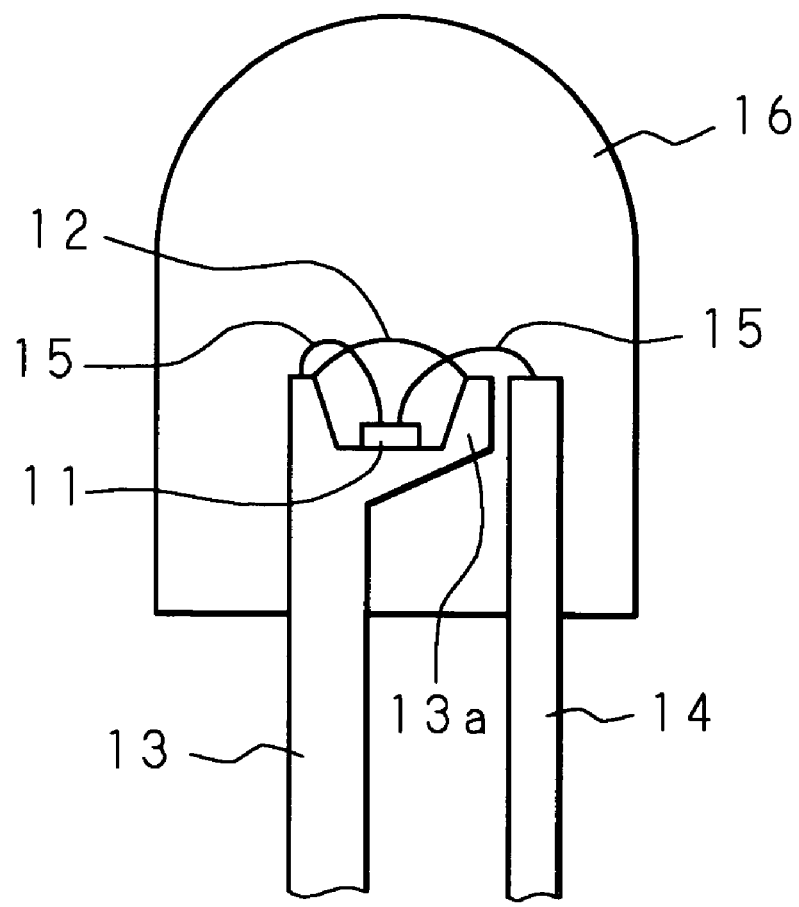
FIG. 1 is a front sectional view showing a conventional LED.
Figure 2:
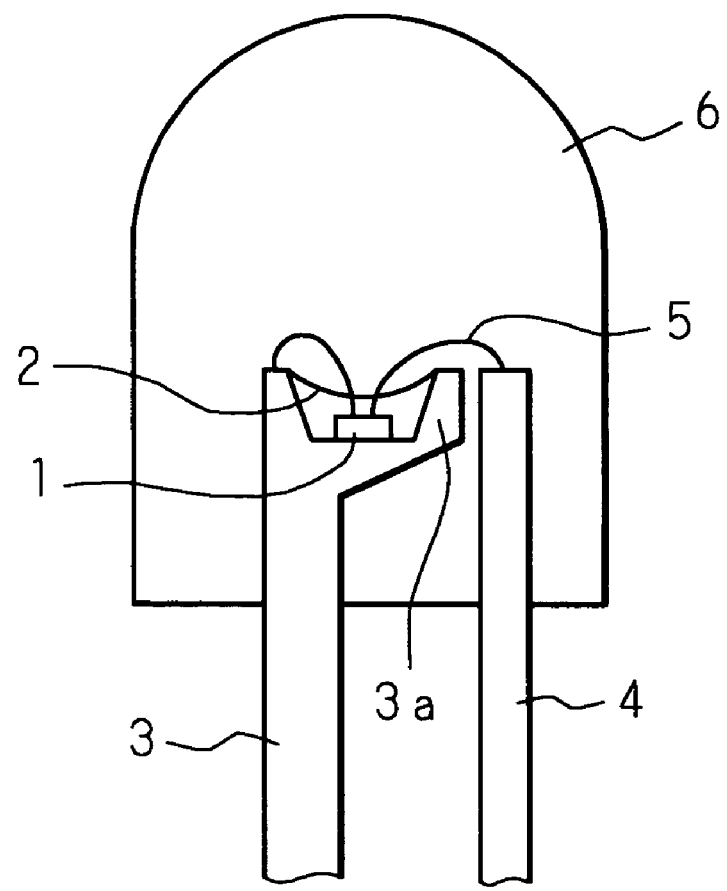
FIG. 2 is a front sectional view showing an LED of the present invention (Embodiments 1 and 2)

FIG. 2 is a front sectional view showing an LED of the present invention. The LED comprises lead frames 3 and 4, and the lead frame 3 has a recessed portion 3a in an end thereof. An LED element 1 constructed by stacking a plurality of semiconductor layers is adhered and fixed on the bottom of the recessed portion 3a by die-bonding. One of the electrodes of the LED element 1 is wire-bonded to the lead frame 3 by a metal wire 5, and the other electrode is wire-bonded to the lead frame 4 by a metal wire 5. The recessed portion 3a is filled with glass according to the present invention at a position closer to the bottom than a plane formed by the brim of the recessed portion 3a, so that a cover 2 covering the LED element 1 is formed. The end of the lead frame 3 where the cover 2 is formed and the end of the lead frame 4 are stored in a mold 6 made of an epoxy resin and having a top functioning as a convex lens.

The glass according to the present invention is low melting point glass with a softening temperature of −40° C. to 300° C. The low melting point glass of Embodiment 1 has a composition composed of 90 mole % of $C_6H_5SiO_{3/2}$ and 10 mole % of $(C_6H_5)_2SiO$. As the starting materials of the low melting point glass, $C_6H_5Si(OC_2H_5)_3$ (phenyl triethoxy silane: hereinafter referred to as PhTES) and $(C_6H_5)_2Si(OC_2H_5)_2$ (diphenyl diethoxy silane: hereinafter referred to as DPDES) are used.

Next, the manufacturing method of low melting point glass of Embodiment 1 will be explained. A solution adjusted so that the mole ratio of PhTES, solution, water and acidic catalyst is 3:10:3:0.1 is produced. When two to three hours have passed from the production of the solution containing PhTES, a 0.1 M ethanol solution of DPDES is dropped into the solution containing PhTES to perform a hydrolysis polycondensation reaction with an open system in the air. Further, two or three hours later, aqueous ammonia is added (PhTES:ammonia=3:0.2) to the solution to completely hydrolyze the solution. Next, after completely gelling the solution at room temperature, the solution is heated at 70° C. for one day and at 110° C. for one day in an oven to remove the remaining ethanol and facilitate the polycondensation reaction, and consequently a precursor gel of glass is obtained. The obtained gel is re-melted by heating it at 100° C. to 200° C. using an aluminum container or a fluororesin container in the air or under reduced pressure, so that the low melting point glass of Embodiment 1 is obtained. The heating process under reduced pressure is performed using a mantle heater or a vacuum drier. Although the low melting point glass of Embodiment 1 has a composition composed of 90 mole % of $C_6H_5SiO_{3/2}$ and 10 mole % of $(C_6H_5)_2SiO$, the percentage of $C_6H_5SiO_{3/2}$ and $(C_6H_5)_2SiO$ may differ from the above-mentioned percentage. The low melting point glass according to the present invention can be realized by a composition composed of a mole % of $C_6H_5SiO_{3/2}$ and b mole % of $(C_6H_5)_2SiO$, where $a+b=100$, $10 \leq a \leq 100$, and $0 \leq b \leq 90$. In particular, when the percentage of a is 60 to 90 and the percentage of b is 10 to 40, excellent characteristics are exhibited.

Next, the manufacturing method of an LED of the present invention using low melting point glass will be explained.

After die-bonding the LED element 1 on the bottom of the recessed portion 3a, the LED element 1 is wire-bonded with the metal wire 5. The recessed portion 3a is filled with the low melting point glass according to the present invention, and heated at 180° C. and then cooled down to room temperature to fabricate the cover 2. Further, the mold 6 is fabricated by molding an epoxy resin on the periphery of the cover 2, the recessed portion 3a and the top end of the lead frame 4, so that the LED of the present invention is obtained. The softening temperature of the glass according to the present invention is lower compared to conventional glass and the work temperature when filling the recessed portion 3a with the melted glass is 300° C. or lower, and therefore it is possible to form the cover 2 without damaging the LED element 1.

Next, the results of a comparison experiment between an LED of the present invention (Embodiment 1) and a conventional LED are shown. The LED of the present invention manufactured using the LED element 1 with a peak wavelength at 630 nm and the conventional LED comprising the LED element 11 similar to the LED element 1 and the cover 12 formed using an epoxy resin were compared in terms of moisture shield performance. After leaving the LED of the present invention and the conventional LED in a constant-temperature and constant-humidity bath with a temperature of 85° C. and humidity of 85% for 1000 hours without turning them on, these LEDs were turned on and their luminous intensities were compared. FIG. 3 is a table showing a change in the luminous intensity of the LED of the present invention (Embodiment 1) and the conventional LED. In this comparison experiment, the luminous intensity of the conventional LED was 70, whereas the luminous intensity of the LED of the present invention was 98 as against 100 before the experiment, and thus it was confirmed that the LED of the present invention can restrain the decrease in the luminous intensity compared to the conventional LED. Since the glass has better moisture shield performance compared to epoxy resins, the LED of the present invention using glass for the cover 2 can reduce the deterioration of the LED element caused by moisture in the air as compared to the conventional LED using an epoxy resin for the cover 12, and the durability of the LED is improved.

Next, the results of a comparison experiment for the resistance to light are shown. After an LED of the present invention manufactured using the LED element 1 with a peak wavelength at 450 nm and a conventional LED comprising the LED element 11 similar to the LED element 1 and the cover 12 formed using an epoxy resin were turned on by passing a current of 20 mA through each of the LEDs and left in a constant-temperature and constant-humidity bath with a temperature of 25° C. and humidity of 35% for 1000 hours, their luminous intensities were compared. FIG. 4 is a table showing a change in the luminous intensity of the LED of the present invention (Embodiment 1) and the conventional LED. The conditions of temperature of 25° C. and humidity of 35% are normal working conditions of LED. In this comparison experiment, the luminous intensity of the conventional LED decreased to 70, whereas the luminous intensity of the LED of the present invention decreased to only 90 as against 100 before the experiment, and thus it was confirmed that the LED of the present invention can restrain the decrease in the luminous intensity compared to the conventional LED. The deterioration of glass, such as yellowing, caused by the application of light is smaller compared to epoxy resins. Therefore, in the LED of the present invention using glass for the cover 2, the deterioration of the cover 2 caused by light is small, and changes in color and luminous intensity after being used over a long period of time are restrained, and consequently the durability of the LED is improved.

The LED of the present invention may be an LED for converting the wavelength of light emitted from the LED element 1 by using a phosphor. After die-bonding the LED element 1 to the bottom of the recessed portion 3a, the LED element 1 is wire-bonded with the metal wire 5. The recessed portion 3a is filled with low melting point glass of Embodiment 1 to which a phosphor CaS:Ce is added, and heated at 180° C. and then cooled down to room temperature to fabricate the cover 2. Further, the mold 6 is fabricated by molding an epoxy resin on the periphery of the cover 2, the recessed portion 3a and the top end of the lead frame 4, so that the LED of the present invention is obtained. The phosphor CaS:Ce is a phosphor for converting blue light into light of a longer wavelength. Part of the blue light emitted from the LED element 1 is absorbed by the phosphor CaS:Ce included in the cover 2, light of a longer wavelength is emitted from the cover 2, and white light is emitted from the LED as a whole.

Next, the results of a comparison experiment between an LED of the present invention (Embodiment 1) that is a white LED using a phosphor as described above and a conventional LED are shown. After the LED of the present invention comprising the LED element 1 with a peak wavelength at 460 nm and the cover 2 made of low melting point glass to which the phosphor CaS:Ce is added and the conventional LED comprising the LED element 11 similar to the LED element 1 and the cover 12 formed using an epoxy resin to which the phosphor CaS:Ce was added were left in a constant-temperature and constant-humidity bath with a temperature of 85° C. and humidity of 85% for 1000 hours without turning them on, these LEDs were turned on and their luminous intensities were compared. FIG. 5 is a table showing a change in the luminous intensity of the LED of the present invention (Embodiment 1) and the conventional LED. In this comparison experiment, the luminous intensity of the conventional LED was 58, whereas the luminous intensity of the LED of the present invention was 92 as against 100 before the experiment, and thus it was confirmed that the LED of the present invention can restrain the decrease in the luminous intensity compared to the conventional LED. Since the phosphor CaS:Ce is deteriorated by moisture, the LED of the present invention with the cover 2 formed using glass having better moisture shield performance compared to epoxy resins can reduce the deterioration of the phosphor CaS:Ce caused by humidity, and the durability of the LED is improved.

Moreover, the composition of the low melting point glass that is glass according to the present invention may be adjusted to provide a characteristic capable of being re-melted repeatedly at temperatures equal to or lower than 300° C. In this case, it is possible to easily process the low melting point glass. Alternatively, the composition of the low melting point glass may be adjusted to provide a characteristic capable of being melted only a predetermined number of times, so that, for example, re-melting at temperatures equal to or lower than 300° C. may be allowed only once. In this case, even when the temperature increases while the LED is being used, the cover 2 does not melt, thereby realizing a durable LED.

As described in detail above, in the LED of the present invention, since the cover 2 for covering the LED element 1 is formed using low melting point glass, the LED has better moisture shield performance and durability against deterioration caused by light and has a smaller change in the color and luminous intensity after being used over a long period of time as compared to a conventional LED using a resin for its cover 12, and therefore the durability and quality of the LED are improved. Moreover, in the present invention, since the cover 2 is formed by filling the recessed portion 3a with the low melting point glass at a position closer to the bottom than a plane formed by the brim of the recessed portion 3a, the light emitted from the LED element 1 and cover 2 is emitted in the aperture direction of the recessed portion 3a, and the leakage of light in a lateral direction due to scattering in the cover 2 is reduced compared to the conventional LED with the cover 12 raised from a plane formed by the brim of the recessed portion 13a, thereby improving the light emission efficiency of the LED. Hence, if the LED of the present invention is used for devices such as a display device, a display, lighting and a backlight of liquid crystals, the reliability of these devices are improved.

Note that although the above explanation illustrates an example in which the cover 2 is formed by adding the phosphor CaS:Ce to the low melting point glass that is glass according to the present invention, the present invention is not limited to this. It may also be possible to form the cover 2 by adding pigments such as phtalocyanine pigments, azo dyes, Methylene Blue, methyl red, or rhodamine dyes to the low melting point glass. With the addition of these pigments, it is possible to color the light emitted by the LED and improve the contrast of the emitted light according to applications. Alternatively, the cover 2 may be formed by adding other phosphor such as CaS:Eu, YAG:Ce, SrS:Eu, or $CaS—Ga_2S_3—EuS$ other than CaS:Ce to the low melting point glass. By using these phosphors, it is possible to convert the wavelength of part of light emitted by the LED and adjust the color of light emitted by the LED according to applications.

Besides, the LED of the present invention does not impose any restriction on the LED element 1 that is a light emitting element, and the LED element 1 may be an LED element having any composition such as a gallium arsenide-based composition and a gallium nitride-based composition, or an LED element having any emission wavelength ranging from ultraviolet to infrared. In particular, the LED element of the present invention may be an LED comprising an LED element 1 with an emission wavelength in a short wavelength region including an ultraviolet region ranging from 280 nm to 450 nm. Since the glass is superior to epoxy resins especially in the durability against ultraviolet rays, the LED of the present invention comprising the LED element 1 with an emission wavelength of 280 nm to 450 nm and the cover 2 formed by adding a phosphor for converting ultraviolet rays into visible light to low melting point glass can be a white LED having high light emission efficiency and excellent durability and used for lighting, etc.

Further, the above explanation illustrates an example in which the cover 2 is made of the low melting point glass that is glass according to the present invention, and the mold 6 is made of an epoxy resin, but the present invention is not limited to this example, and may be embodied in a form in which the mold 6 is made of a transparent resin other than epoxy resins, or in a form in which the mold 6 is also made of low melting point glass. Alternatively, the present invention may be embodied in a form in which the difference between the cover 2 and the mold 6 is eliminated, and the mold 6 serving also as the cover 2 may be formed using low melting point glass.

EMBODIMENT 2

Low melting point glass of Embodiment 2 that is glass according to the present invention has a composition composed of 90 mole % of $C_6H_5SiO_{3/2}$ and 10 mole % of $(CH_3)_2SiO$. As the starting materials of the low melting point glass, PhTES and $(CH_3)_2Si(OC_2H_5)_2$ (dimethyl diethoxy silane: hereinafter referred to as DMDES) are used.

A solution adjusted so that the mole ratio of PhTES, solution, water and acidic catalyst is 3:10:3:0.1 is produced, and then, when two to three hours have passed, a 0.1 M ethanol solution of DMDES is dropped into the solution to perform a hydrolysis polycondensation reaction with an open system in the air. Further, two or three hours later, aqueous ammonia is added (PhTES:ammonia=3:0.2) to the solution to completely hydrolyze the solution. Next, after completely gelling the solution at room temperature, the solution is heated at 70° C. for one day and at 110° C. for one day in an oven to remove the remaining ethanol and facilitate the polycondensation reaction, and consequently a precursor gel of glass is obtained. The obtained gel is re-melted by heating it at 100° C. to 200° C. using an aluminum container or a fluororesin container in the air or under reduced pressure so that the low melting point glass of Embodiment 2 is obtained. The heating process under reduced pressure is performed using a mantle heater or a vacuum drier. Although the low melting point glass of Embodiment 2 has a composition composed of 90 mole % of $C_6H_5SiO_{3/2}$ and 10 mole % of $(CH_3)_2SiO$, the percentage of $C_6H_5SiO_{3/2}$ and $(CH_3)_2SiO$ may differ from the above-mentioned percentage. The low melting point glass according to the present invention can be realized by a composition composed of a mole % of $C_6H_5SiO_{3/2}$ and b mole % of $(CH_3)_2SiO$, where a+b=100, $10 \leq a \leq 100$, and $0 \leq b \leq 90$. In particular, when the percentage of a is 60 to 90 and the percentage of b is 10 to 40, excellent characteristics are exhibited.

A cover 2 is formed using low melting point glass as described above, and an LED is manufactured in the same manner as in Embodiment 1. Since the structure of the LED is the same as that of Embodiment 1, the explanation thereof is omitted.

Next, the results of a comparison experiment between the LED of the present invention (Embodiment 2) and a conventional LED are shown. The LED of the present invention manufactured using the LED element 1 with a peak wavelength at 630 nm and the conventional LED comprising the LED element 11 similar to the LED element 1 and the cover 12 formed using an epoxy resin were compared in terms of moisture shield performance. After leaving the LED of the present invention and the conventional LED in a constant-temperature and constant-humidity bath with a temperature of 85° C. and humidity of 85% for 1000 hours without turning them on, these LEDs were turned on and their luminous intensities were compared. FIG. 6 is a table showing a change in the luminous intensity of the LED of the present invention (Embodiment 2) and the conventional LED. In this comparison experiment, the luminous intensity of the conventional LED was 71, whereas the luminous intensity of the LED of the present invention was 97 as against 100 before the experiment, and thus it was confirmed that the LED of the present invention can restrain the decrease in the luminous intensity compared to the conventional LED. Moreover, in order to compare these LEDs in terms of the resistance to light, an LED of the present invention (Embodiment 2) manufactured using the LED element 1 with a peak wavelength at 450 nm and a conventional LED comprising the LED element 11 similar to the LED element 1 and the cover 12 formed using an epoxy resin were turned on by passing a current of 20 mA through each of the LEDs and left in a constant-temperature and constant-humidity bath with a temperature of 25° C. and humidity of 30% for 1000 hours, and then their luminous intensities were compared. FIG. 7 is a table showing a change in the luminous intensity of the LED of the present invention (Embodiment 2) and the conventional LED. In this comparison experiment, the luminous intensity of the conventional LED decreased to 70, whereas the luminous intensity of the LED of the present invention decreased to only 93 as against 100 before the experiment, and thus it was confirmed that the LED of the present invention can restrain the decrease in the luminous intensity compared to the conventional LED. As described above, in Embodiment 2, the LED of the present invention can also reduce the deterioration of the LED element caused by moisture and restrain changes in color and luminous intensity after being used over a long period of time as compared to the conventional LED using an epoxy resin for the cover 12, and therefore the durability and quality of the LED is improved.

Besides, similarly to Embodiment 1, the LED of Embodiment 2 may be an LED that converts the wavelength of light emitted from the LED element 1 by using a phosphor. An LED using a phosphor in the same manner as in Embodiment 1 is manufactured by adding a phosphor CaS:Ce to the low melting point glass of Embodiment 2 and forming the cover 2. Similarly to Embodiment 1, the wavelength of part of blue light emitted by the LED element 1 is converted, and white light is emitted from the LED as a whole. After the LED of the present invention comprising the LED element 1 with a peak wavelength at 460 nm and the cover 2 made of the low melting point glass to which the phosphor CaS:Ce is added and a conventional LED comprising the LED element 11 similar to the LED element 1 and the cover 12 formed using an epoxy resin were left in a constant-temperature and constant-humidity bath with a temperature of 85° C. and humidity of 85% for 1000 hours without turning them on, these LEDs were turned on and their luminous intensities were compared. FIG. 8 is a table showing a change in the luminous intensity of the LED of the present invention (Embodiment 2) and the conventional LED. In this comparison experiment, the luminous intensity of the conventional LED was 60, whereas the luminous intensity of the LED of the present invention was 91 as against 100 before the experiment, and thus it was confirmed that the LED of the present invention can restrain the decrease in the luminous intensity compared to the conventional LED. In Embodiment 2, the LED with the cover 2 formed by adding the phosphor to the low melting point glass also reduces the deterioration of the phosphor CaS:Ce caused by moisture, and therefore the durability of the LED is improved.

Note that Embodiment 1 illustrates an example using low melting point glass having a composition composed of $C_6H_5SiO_{3/2}$ and $(C_6H_5)_2SiO$ and Embodiment 2 illustrates an example using low melting point glass having a composition composed of $C_6H_5SiO_{3/2}$ and $(CH_3)_2SiO$, but the composition of glass according to the present invention is not limited to those mentioned above, and the LED of the present invention may be an LED with a cover 2 formed using glass having a composition composed of a mole % of $CH_3SiO_{3/2}$ and b mole % of $(C_6H_5)_2SiO$, where a+b=100, $10 \leq a \leq 100$, and $0 \leq b \leq 90$, or may be an LED with a cover 2 formed using glass having a composition composed of a mole % of $CH_3SiO_{3/2}$ and b mole % of $(CH_3)_2SiO$, where at b=100, $10 \leq a \leq 100$, and $0 \leq b \leq 90$. Even in this case, when the percentage of a is between 60 and 90 and the percentage of b is between 10 and 40, superior characteristics are exhibited. Further, the LED of the present invention may be a more general LED with a cover 2 formed using other glass having a composition including $R_nSiO_{2-n/2}$. Here, R is any one group selected from a phenyl group ($C_6H_5$—), an ethyl group ($C_2H_5$—), a methyl group ($CH_3$—), a benzoyl group ($C_6H_5CO$—), a benzyl group ($C_6H_5CH_2$—) and a vinyl group ($CH_2$=$CH$—), and the glass according to the present invention may have a composition including a plurality of components among these $R_nSiO_{2-n/2}$. The low melting point glass that is glass according to the present invention has a softening temperature of −40° C. to 300° C. which is much lower compared to conventional low melting point glass with a melting point around 400° C. Therefore, the glass is softened at temperatures not higher than the heat resistance limit of the LED element 1; the cover 2 or the mold 6 can be formed safely without damaging the LED element 1; the cover 2 or the mold 6 has improved resistance to deterioration caused by light of a short wavelength and improved moisture shield performance; and the durability and quality of the LED are improved.

EMBODIMENT 3

Figure 9:
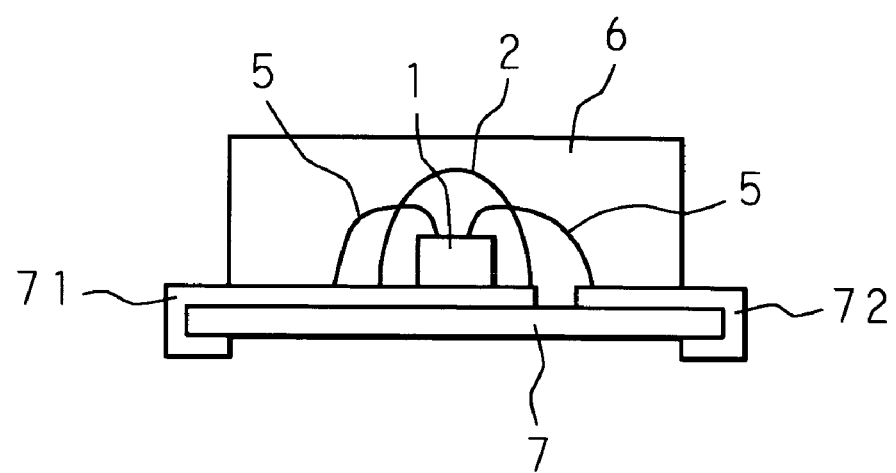
FIG. 9 is a sectional view showing an LED of the present invention (Embodiment 3).

FIG. 9 is a cross section showing an LED of Embodiment 3. In FIG. 9, numeral 7 represents a wiring board, and the LED of Embodiment 3 is a surface mount LED in which an LED element 1 is mounted on a surface of the wiring board 7. Electrodes 71 and 72 connectable to external devices are formed from both ends toward the surface of the wiring board 7 so that they are separated from each other, and the LED element 1 is mounted on the surface of one electrode 71 formed on the surface of the wiring board 7. One of the electrodes of the LED element 1 is wire-bonded to the electrode 71 by a metal wire 5, while the other electrode is wire-bonded to the electrode 72 on the surface of the wiring board 7 by a metal wire 5. A cover 2 is formed using low melting point glass similar to the low melting point glass of Embodiment 1 or Embodiment 2 on the periphery of the LED element 1, and the cover 2 covers the entire LED element 1 including a light emitting surface. Further, the cover 2, the wires 5 and 5, and the electrodes 71 and 72 formed on the surface of the wiring board 7 are covered with a mold 6 made of an epoxy resin.

In Embodiment 3, since the LED element 1 of the LED of the present invention is also covered with the cover 2 using glass according to the present invention, the resistance to deterioration caused by light of a short wavelength or the moisture shield performance is improved, and the durability and quality of the surface mount LED are improved.

Note that although the above-described example illustrates an embodiment in which the entire LED element 1 is covered with the cover 2, but the present invention is not limited to this and may be embodied in a form in which the light emitting surface that is a part of the LED element 1 is covered with the cover 2 made of low melting point glass, and the LED element 1 and cover 2 are covered with the mold 6 made of an epoxy resin or low melting point glass. In this embodiment, the cover 2 which receives light from the light emitting surface of the LED element 1 also has improved durability against light, and, if the cover 2 contains a phosphor, the shield performance against moisture that deteriorates the phosphor is improved, and the durability of the surface mount LED is improved.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

The invention claimed is:

1. A light emitting diode comprising:
a light emitting diode element; and
a transparent cover covering said light emitting diode element partly or completely,
wherein said cover is formed using glass having a composition including $R_nSiO_{2-n/2}$,
where 0<n<4, R is at least one group selected from a phenyl group ($C_6H_5$—), an ethyl group ($C_2H_5$—), a methyl group ($CH_3$—), a benzoyl group ($C_6H_5CO$—), a benzyl group ($C_6H_5CH_2$—) and a vinyl group ($CH_2$=$CH$—).

2. The light emitting diode of claim 1, wherein
the glass has a softening temperature ranging from −40° C. to 300° C.

3. The light emitting diode of claim 2, wherein
the glass is capable of being re-melted repeatedly within the softening temperature range.

4. The light emitting diode of claim 2, wherein
the glass is capable of being melted only a predetermined number of times within the softening temperature range.

5. The light emitting diode of claim 1, wherein
said cover is formed by further adding one or a plurality of kinds of pigments, or a phosphor for converting an emission wavelength of said light emitting diode element, to the glass.

6. The light emitting diode of claim 1, further comprising:
a lead frame having a recessed portion; and
a transparent mold for covering said recessed portion and said cover,
wherein said light emitting diode element is mounted on a bottom of said recessed portion, and said recessed portion in which said light emitting diode element is mounted on the bottom is filled with said cover.

7. The light emitting diode of claim 6, wherein
said recessed portion is filled with said cover at a position closer to the bottom than a plane formed by a brim of said recessed portion.

8. The light emitting diode of claim 1, further comprising:
a wiring board,
wherein said light emitting diode element is mounted on said wiring board.

9. The light emitting diode of claim 1,
wherein said light emitting diode element has an emission wavelength of 280 nm to 450 nm.

10. A light emitting diode comprising:
a light emitting diode element; and
a transparent cover covering said light emitting diode element partly or completely,
wherein said cover is formed using glass having a composition composed of a mole % of $C_6H_5SiO_{3/2}$ and b mole % of $(C_6H_5)_2SiO$, where a+b=100, $10 \leq a \leq 100$, and $0 \leq b \leq 90$.

11. The light emitting diode of claim 10, wherein
a=60 to 90, and b=10 to 40.

12. A light emitting diode comprising:
a light emitting diode element; and
a transparent cover covering said light emitting diode element partly or completely, wherein said cover is formed using glass having a composition composed of a mole % of $C_6H_5SiO_{3/2}$ and b mole % of $(CH_3)_2SiO$, where a+b=100, $10 \leqq a \leqq 100$, and $0 \leqq b \leqq 90$.

13. The light emitting diode of claim 12 wherein a=60 to 90, and b=10 to 40.

14. A light emitting diode comprising:
a light emitting diode element; and
a transparent cover covering said light emitting diode element partly or completely,
wherein said cover is formed using glass having a composition composed of a mole % of $CH_3SiO_{3/2}$ and b mole % of $(CH_6H_5)_2SiO$, where a+b=100, $10 \leqq a \leqq 100$, and $0 \leqq b \leqq 90$.

15. The light emitting diode of claim 14, wherein a=60 to 90, and b=10 to 40.

16. A light emitting diode comprising:
a light emitting diode element; and
a transparent cover covering said light emitting diode element partly or completely,
wherein said cover is formed using glass having a composition composed of a mole % of $CH_3SiO_{3/2}$ and b mole % of $(CH_3)_2SiO$, where a+b=100, $10 \leqq a \leqq 100$, and $0 \leqq b \leqq 90$.

17. The light emitting diode of claim 16, wherein a=60 to 90, and b=10 to 40.

* * * * *